(12) United States Patent
Sarpatwari et al.

(10) Patent No.: US 8,638,607 B2
(45) Date of Patent: Jan. 28, 2014

(54) DISTURB VERIFY FOR PROGRAMMING MEMORY CELLS

(75) Inventors: Karthik Sarpatwari, Boise, ID (US);
Akira Goda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/267,602

(22) Filed: Oct. 6, 2011

(65) Prior Publication Data

US 2013/0088916 A1 Apr. 11, 2013

(51) Int. Cl.
*G11C 11/34* (2006.01)

(52) U.S. Cl.
USPC ............. 365/185.17; 365/185.19; 365/230.03

(58) Field of Classification Search
USPC ........................... 365/185.17, 185.19, 230.03
See application file for complete search history.

(56) References Cited

U.S. PATENT DOCUMENTS

| | | | |
|---|---|---|---|
| 7,511,996 B2 | 3/2009 | Kim | |
| 7,619,933 B2 | 11/2009 | Sarin | |
| 2010/0110792 A1* | 5/2010 | Lutze et al. | ............... 365/185.17 |
| 2010/0128521 A1 | 5/2010 | Mizuguchi et al. | |

OTHER PUBLICATIONS

Lee, Changhyuk, et al. "A 32Gb MLC NAND Flash Memory with Vth Endurance Enhancing Schemes in 32nm CMOS." Solid-State Circuits Conference Digest of Technical Papers, 2011 IEEE International, Feb. 20-24, 2011, San Francisco, California (27 pgs.).

* cited by examiner

*Primary Examiner* — Jason Lappas
(74) *Attorney, Agent, or Firm* — Brooks, Cameron & Huebsch, PLLC

(57) ABSTRACT

Apparatuses and methods for disturb verify for programming operations are described. Programming memory cells can include applying a number of programming pulses to a first memory cell, performing a disturb verify operation on a second memory cell adjacent to the first memory cell, and inhibiting the first memory cell from further programming in response to the second memory cell failing the disturb verify operation. Other apparatuses and methods are also disclosed.

15 Claims, 11 Drawing Sheets

US 8,638,607 B2

DISTURB VERIFY FOR PROGRAMMING MEMORY CELLS

TECHNICAL FIELD

The present disclosure relates generally to semiconductor memory devices, methods, and systems, and more particularly, to disturb verify for programming memory cells.

BACKGROUND

Memory devices are typically provided as internal, semiconductor, integrated circuits in computers or other electronic devices. There are many different types of memory including volatile and non-volatile memory. Volatile memory can require power to maintain its information and includes random-access memory (RAM), dynamic random access memory (DRAM), and synchronous dynamic random access memory (SDRAM), among others. Non-volatile memory can provide persistent information by retaining stored information when not powered and can include NAND flash memory, NOR flash memory, read only memory (ROM), Electrically Erasable Programmable ROM (EEPROM), Erasable Programmable ROM (EPROM), phase change random access memory (PCRAM), resistive random access memory (RRAM), and magnetic random access memory (MRAM), such as spin torque transfer random access memory (STT RAM), among others.

Memory devices can be combined together to form a solid state drive (SSD). A solid state drive can include non-volatile memory, e.g., NAND flash memory and NOR flash memory, and/or can include volatile memory, e.g., DRAM and SRAM, among various other types of non-volatile and volatile memory. Flash memory devices, including floating gate flash devices and charge trap flash (CTF) devices using semiconductor-oxide-nitride-oxide-semiconductor and metal-oxide-nitride-oxide-semiconductor capacitor structures that store information in charge traps in the nitride layer, may be utilized as non-volatile memory for a wide range of electronic applications. Flash memory devices typically use a one-transistor memory cell that allows for high memory densities, high reliability, and low power consumption.

Memory cells in an array architecture can be programmed to a desired data state. That is, electric charge can be placed on or removed from a charge storage structure, e.g., a floating gate or charge trap, of a memory cell to program the cell to one of a number of data states. For example, a single level cell (SLC) can be programmed to one of two data states, such as to represent one of two binary units, e.g., 1 or 0. Flash memory cells can also be programmed to one of more than two data states, such as to represent one of, e.g., 1111, 0111, 0011, 1011, 1001, 0001, 0101, 1101, 1100, 0100, 0000, 1000, 1010, 0010, 0110, and 1110. Such cells may be referred to as multi state memory cells, multiunit cells, or multilevel cells (MLCs). MLCs can allow the manufacture of higher density memories without increasing the number of memory cells since each cell can represent more than one digit, e.g., more than one bit. One of the data states can be an erased state. For example, the "lowermost" data state may not be programmed above the erased state, that is, if the cell is programmed to the lowermost data state, it remains in the erased state rather than having a charge applied to the cell during a programming operation. The other data states can be referred to as "non-erased" states.

Some memory devices including NAND arrays may be programmed such that not all of the cells coupled to a particular access line are programmed at the same time, e.g., as in shielded bit line (SBL) programming, which may include separately programming alternate cells coupled to a particular access line. Some memory devices including NAND arrays may be programmed such that all of the cells coupled to a particular access line are programmed simultaneously, such as in all bit line (ABL) programming. In ABL programming, capacitive coupling between adjacent memory cells can have adverse effects on the memory cell being programmed. However, ABL programming can provide faster programming operations with respect to SBL programming, as all of the cells coupled to a particular access line can be programmed at the same time.

DETAILED DESCRIPTION

Figure 1A:
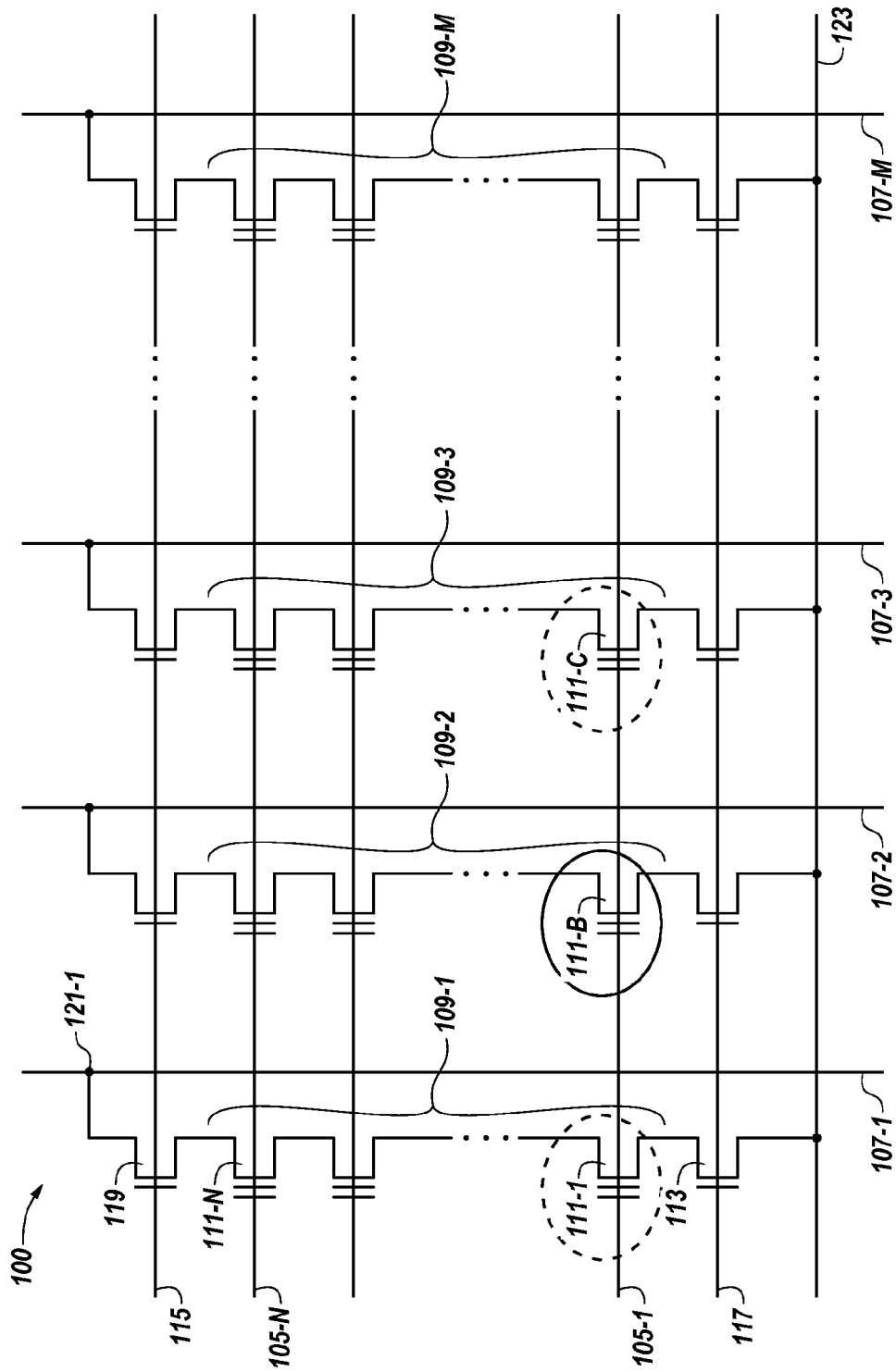
FIG. 1A illustrates a schematic diagram of a portion of a non-volatile memory array in accordance with a number of embodiments of the present disclosure.

Apparatuses and methods for disturb verify for programming operations are described. For example, programming memory cells can include applying a number of programming pulses to a first memory cell, performing a disturb verify operation on a second memory cell adjacent to the first memory cell, and inhibiting the first memory cell from programming in response to the second memory cell failing the disturb verify operation.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N" and "M," particularly with respect to reference numerals in the drawings, indicates that a number of the particular feature so designated can be included with a number of embodiments of the present disclosure. As used herein, "a number of" something can refer to one or more of such things.

The figures herein follow a numbering convention in which the first digit or digits correspond to the drawing figure number and the remaining digits identify an element or component in the drawing. Similar elements or components between different figures may be identified by the use of similar digits. For example, 100 may reference element "00" in FIG. 1A, and a similar element may be referenced as 500 in FIG. 5. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1A illustrates a schematic diagram of a portion of a non-volatile memory array 100 in accordance with a number of embodiments of the present disclosure. The embodiment of FIG. 1A illustrates a NAND architecture non-volatile memory array. However, embodiments described herein are not limited to this example. As shown in FIG. 1A, the memory array 100 includes access lines, e.g., word lines 105-1, . . . , 105-N and intersecting data lines, e.g., local bit lines 107-1, 107-2, 107-3, . . . , 107-M. For ease of addressing in the digital environment, the number of word lines 105-1, . . . 105-N and the number of local bit lines 107-1, 107-2, 107-3, . . . , 107-M can be some power of two, e.g., 256 word lines by 4,096 bit lines.

Memory array 100 includes NAND strings 109-1, 109-2, 109-3, . . . , 109-M. Each NAND string includes non-volatile memory cells 111-1, . . . , 111-N, each communicatively coupled to a respective word line 105-1, . . . , 105-N. Each NAND string (and its constituent memory cells) is also associated with a local bit line 107-1, 107-2, 107-3, . . . , 107-M. The non-volatile memory cells 111-1, . . . , 111-N of each NAND string 109-1, 109-2, 109-3, . . . , 109-M are connected in series source to drain between a source select gate (SGS), e.g., a field-effect transistor (FET) 113, and a drain select gate (SGD), e.g., FET 119. Each source select gate 113 is configured to selectively couple a respective NAND string to a common source 123 responsive to a signal on source select line 117, while each drain select gate 119 is configured to selectively couple a respective NAND string to a respective bit line responsive to a signal on drain select line 115.

As shown in the embodiment illustrated in FIG. 1A, a source of source select gate 113 is connected to a common source line 123. The drain of source select gate 113 is connected to the source of the memory cell 111-1 of the corresponding NAND string 109-1. The drain of drain select gate 119 is connected to bit line 107-1 of the corresponding NAND string 109-1 at drain contact 121-1. The source of drain select gate 119 is connected to the drain of the last memory cell 111-N, e.g., a floating-gate transistor, of the corresponding NAND string 109-1.

In a number of embodiments, construction of the non-volatile memory cells 111-1, . . . , 111-N includes a source, a drain, a charge storage structure, such as a floating gate, and a control gate. The non-volatile memory cells 111-1, . . . , 111-N have their control gates coupled to a word line, 105-1, . . . , 105-N respectively. A "column" of the non-volatile memory cells include a number of strings 109 coupled to a given local bit line 107. A "row" of the non-volatile memory cells are those memory cells commonly coupled to a given word line 105-1, . . . , 105-N. The use of the terms "column" and "row" is not meant to imply a particular linear, e.g., vertical and/or horizontal, orientation of the non-volatile memory cells. A NOR array architecture would be similarly laid out, except that the string of memory cells would be coupled in parallel between the select gates.

Subsets of cells, in an SBL architecture, or all of the cells, in an ABL architecture, coupled to a selected word line, e.g., 105-1, . . . , 105-N, can be programmed and/or sensed, e.g., read, together as a page of memory cells. A programming operation, e.g., a write operation, can include applying a number of programming pulses, e.g., 16V-20V, to a selected word line in order to increase the threshold voltage (Vt) of selected cells coupled to that selected access line to a desired program voltage level corresponding to a target, e.g., desired, data state. In some instances, a particular memory cell may be "slow" to program to a target data state meaning that the particular memory cell may require more programming pulses and/or higher voltage programming pulses to reach the target data state than other memory cells that are programmed to the same data state.

In some instances, such as with an SBL architecture, the bit lines 107-1, . . . , 107-M can be separated into even numbered bit lines and odd numbered bit lines. In such cases, cells corresponding to a selected word line and even numbered bit lines can be programmed together and referred to as an even page of data. Similarly, cells corresponding to the selected word line and odd numbered bit lines can be programmed together and referred to as an odd page of data. The cells coupled to alternating even numbered and odd numbered bit lines, e.g., an even page and an odd page, can be programmed and/or sensed at different times. For instance, even pages associated with selected word lines can be programmed and/or sensed before the odd pages associated with the selected word lines.

An erase operation can include applying a relatively high potential difference between the control gates of the memory cells and their channel regions in order to remove charge, e.g., electrons, from the charge storage structures of the cells. In a NAND array, a block of memory cells including multiple pages of memory cells can be erased together in an erase operation. For example, 20V can be applied to the substrate body and 0V is applied to the control gates of the cells in a block of memory cells being erased. The high voltage erase pulse is intended to inject electrons from the charge storage structures of the memory cells into the substrate active area.

A sensing operation, such as a read or program verify operation, can include sensing a voltage and/or current change of a bit line coupled to a selected cell in order to determine the data state of the selected cell. The sensing operation can involve applying a signal to, e.g., biasing, a bit line, e.g., bit line 107-1, associated with a selected memory cell above a signal, e.g., bias voltage, applied to a source line, e.g., source line 123, associated with the selected memory cell. A sensing operation can include precharging the bit line 107-1 followed with discharge when a selected cell begins to conduct, and sensing the discharge.

Sensing the data state of a selected cell can include applying a number of sensing signals, e.g., a read voltage, to a selected word line while applying a number of pass signals, e.g., read pass voltages, to the word lines coupled to the unselected cells of the string sufficient to place the unselected cells in a conducting state independent of the threshold voltage of the unselected cells. The bit line corresponding to the selected cell being read and/or verified can be sensed to determine whether or not the selected cell conducts in response to the particular sensing voltage applied to the selected word line. For example, the data state of a selected cell can be determined by the word line voltage at which the bit line current reaches a particular reference current associated with a particular data state.

As one of ordinary skill in the art will appreciate, in a sensing operation performed on a selected memory cell in a NAND string, the unselected memory cells of the string are biased so as to be in a conducting state. In such a sensing operation, the data state of the selected cell can be determined based on the current and/or voltage sensed on the bit line corresponding to the string. For instance, the data state of the selected cell can be determined based on whether the bit line current changes by a particular amount or reaches a particular level in a given time period.

When the selected cell is in a conductive state, current flows between the source line contact at one end of the string and a bit line contact at the other end of the string. As such, the current associated with sensing the selected cell is carried through each of the other cells in the string and the select transistors.

A program verify operation is a sensing operation that can be used to verify whether a selected memory cell has reached a target data state, e.g., by determining whether a threshold voltage of the selected memory cell has reached a program verify level associated with the target data state. A program verify level can be a lowermost voltage associated with a particular threshold voltage distribution, e.g., a particular desired threshold voltage distribution, corresponding to a particular data state. A disturb verify operation can refer to a sensing operation used to verify that a particular memory cell has not exceeded a disturb threshold, e.g., exceeded an upper acceptable voltage for the particular data state of the particular cell such as an upper acceptable voltage for the erased state. For example, in FIG. 1A, memory cell 111-B is a programming cell, e.g., is being programmed, and may have a program verify operation performed thereon. Memory cell 111-1 and memory cell 111-C are adjacent to memory cell 111-B on word line 105-1. In some embodiments, one or more of memory cell 111-1 and memory cell 111-C may have a disturb verify operation performed thereon during the programming of memory cell 111-B. Disturb verify operations are described in more detail herein.

Figure 1B:
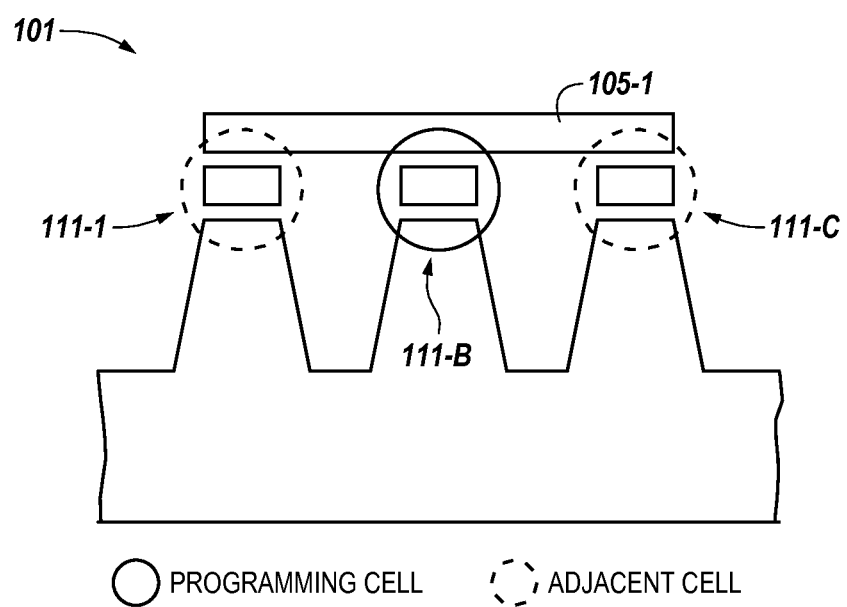
FIG. 1B illustrates a cross-sectional diagram of a portion of the non-volatile memory array illustrated in FIG. 1A.

FIG. 1B illustrates a cross-sectional diagram of a portion 101 of the non-volatile memory array 100 illustrated in FIG. 1A. The portion 101 of the array 100 includes memory cell 111-1, memory cell 111-B, and memory cell 111-C illustrated with a portion of the word line 105-1. FIG. 1B provides a clear indication that memory cell 111-1 and memory cell 111-C are adjacent, e.g., oppositely adjacent, to memory cell 111-B. "Oppositely adjacent" means that memory cell 111-1 and 111-C are adjacent to memory cell 111-B and on opposite sides of memory cell 111-B along word line 105-1.

Figure 2:
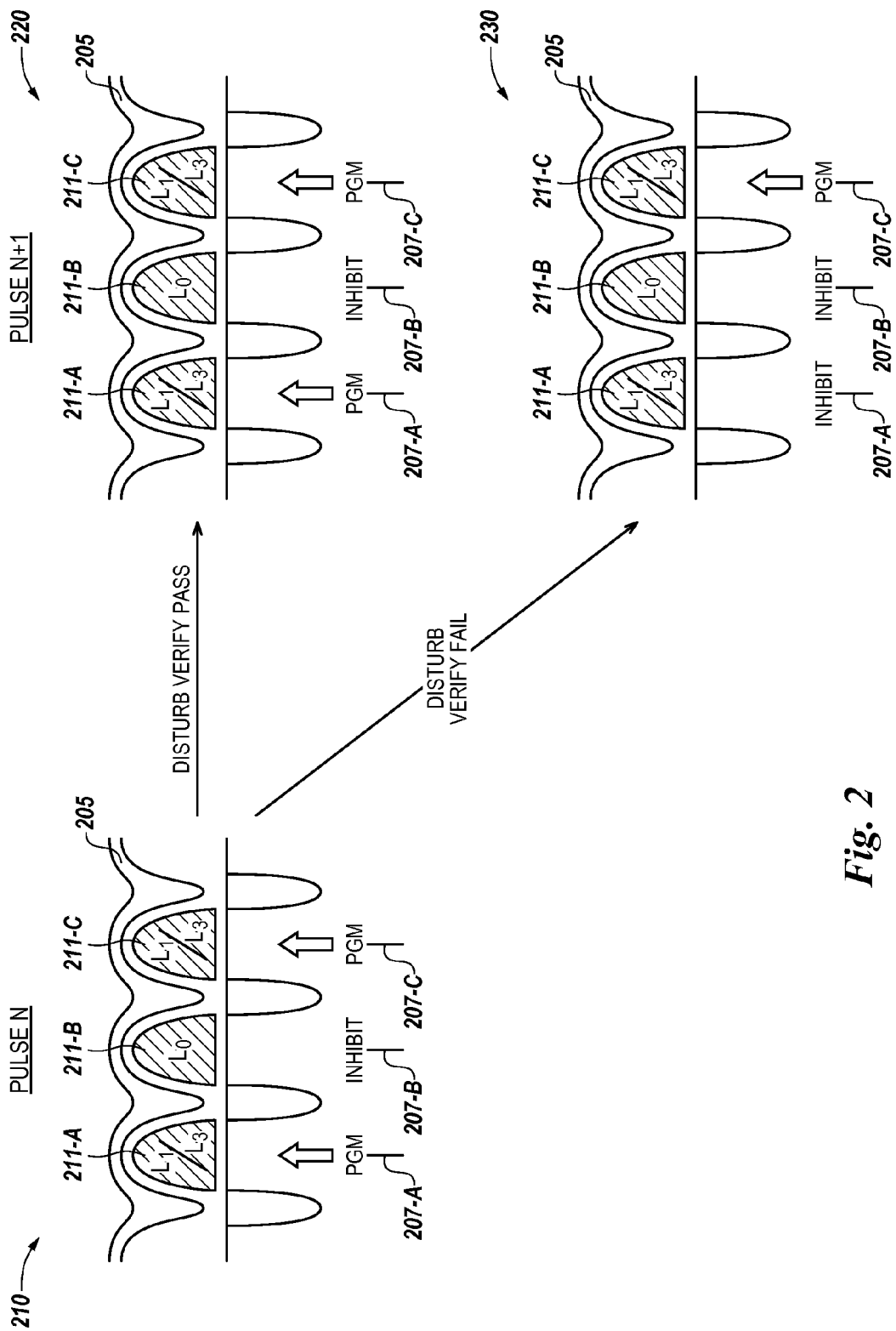
FIG. 2 illustrates a cross-sectional diagram of a number of memory cells during a programming operation.

FIG. 2 illustrates a cross-sectional diagram of a number of memory cells during a programming operation. The first image 210 illustrates a particular programming pulse, e.g., "Pulse N." The second image 220 and the third image 230 each illustrate different variations associated with a subsequent programming pulse, e.g., "Pulse N+1." A program verify operation can be performed between programming pulses to determine whether a selected memory cell has reached a desired data state, e.g., whether the selected memory cell will be program inhibited during a subsequent programming pulse.

As illustrated in image 210, two memory cells 211-A and 211-C are enabled for programming, while memory cell 211-B is inhibited from programming, e.g., cell 211-B is left in a lower data state such as an erased state, e.g., "$L_0$." Memory cells 211-A and 211-C are oppositely adjacent to the memory cell 211-B. The memory cells 211-A, 211-B, and 211-C are coupled to a same word line 205. Each memory cell 211-A, 211-B, and 211-C is associated with, e.g., coupled to, a separate bit line, e.g., bit lines 207-A, 207-B, and 207-C. Thus, bit lines 207-A and 207-C are oppositely adjacent to bit line 207-B. The layout of the bit lines 207-A, 207-B, and 207-C illustrated in FIG. 2 is intended to show an association between the memory cells 211-A, 211-B, and 211-C and the bit lines 207-A, 207-B, and 207-C, respectively, rather than a layout of the physical locations thereof. One of ordinary skill in the art will appreciate that bit lines may be formed in a number of locations with respect to the memory cells with which they are associated.

Memory cells 211-A, 211-B, and 211-C, coupled to word line 205, can be analogous to memory cells 111-1, 111-B, and 111-C, coupled to word line 105-1 in FIG. 1A. Likewise bit lines 207-A, 207-B, and 207-C can be analogous to bit lines 107-1, 107-2, and 107-3 in FIG. 1A. With respect to images 210 and 220, capacitive coupling can occur between the floating gates of memory cell 211-B and the floating gates of adjacent memory cells 211-A and 211-C. With respect to images 210 and 220, capacitive coupling can occur between the floating gate of memory cell 211-B and channel regions underlying adjacent memory cells 211-A and 211-C. As memory devices are scaled to smaller sizes, capacitive coupling between adjacent components can increase because of the shorter distances between components.

Applying a program inhibit signal to a bit line, e.g., bit line 207-A as illustrated in image 230, can effectively turn off the drain select transistor, e.g., drain select transistor 119 illustrated in FIG. 1A, and disconnect the NAND string, e.g., NAND string 109-1, from its associated bit line, e.g., bit line 107-1. This, in turn, floats the channels associated with the memory cells of the NAND string so that a respective channel, e.g., the channel associated with memory cell 211-A, can be boosted to a voltage roughly proportional to a voltage applied to a respective word line, e.g., word line 205, associated with a respective memory cell. Boosting the channel as such, e.g., to approximately the voltage applied to the word line, can effectively reduce a potential difference between the channel and the charge storage structure, e.g., the floating gate, which can inhibit programming of the memory cell, e.g., discourage electron transfer between the channel and the charge storage structure.

During a programming operation, e.g., an ABL programming operation, of a selected memory cell, e.g., memory cell 211-A, a program enable voltage, e.g., 0 V, can be applied to a bit line, e.g., bit line 207-A, associated with the selected memory cell. Thus, as illustrated in image 210, during an example programming pulse in which the memory cells 211-A and 211-C are receiving the programming pulse, the bit lines 207-A and 207-C have the same voltage applied thereto, e.g., a program enable voltage "Pgm." Likewise, as the memory cells 211-A and 211-C are coupled to the same word line 205, control gates of the memory cells 211-A and 211-C can have the same voltage applied thereto. An inhibit voltage is applied to bit line 207-B to inhibit memory cell 211-B from programming while memory cells 211-A and 211-C receive charge from the programming Pulse N applied to word line 205. An inhibit voltage applied to a bit line may generally be larger than a program enable voltage applied to a bit line.

As the programming pulse N is applied to the word line 205 and to the floating gates of memory cells 211-A and 211-C, capacitive coupling can occur between the floating gates of the memory cells 211-A and 211-C and the adjacent memory cell 211-B therebetween. Such capacitive coupling can contribute charge to the floating gate of the memory cell 211-B, which may result in sensing errors such as read errors and/or program verify errors, e.g., by shifting the Vt of the memory cell to a higher level, e.g., to a higher data state. The accumulation of charge by a memory cell that is not being programmed, whether through capacitive coupling with an adjacent cell or via another mechanism, is referred to herein as program disturb, e.g., the programming operation of one memory cell disturbs the charge stored on another memory cell.

According to a number of embodiments of the present disclosure, a disturb verify operation can be performed on a particular memory cell, e.g., memory cell 211-B, to determine whether a threshold voltage of the particular memory cell exceeds a disturb threshold as described in more detail herein. The memory cell 211-B can pass the disturb verify operation if the threshold voltage of the memory cells 211-B does not exceed a disturb threshold. The memory cell 211-B can fail the disturb verify operation if the threshold voltage of the memory cell 211-B exceeds the disturb threshold. Assuming, for the sake of explanation, that the memory cells 211-A and 211-C are to receive additional programming pulses to reach their respective target data states, e.g., that memory cells 211-A and 211-C fail a program verify operation. According to the present disclosure, if memory cell 211-B passes the disturb verify operation, then the memory cells 211-1 and 211-C can be enabled for programming, e.g., during the application of an additional programming pulse, such as pulse N+1, as illustrated in image 220. If memory cell 211-B fails the disturb verify operation, then at least one of the memory cells 211-A and 211-C can be inhibited from programming, e.g., during the application of an additional programming pulse as illustrated in image 230.

According to at least one example of a "worst case" scenario for program disturb can occur when a target data state of a memory cell, e.g., memory cell 211-B, is a lowermost data state "$L_0$" and a target data state for both adjacent memory cells on the word line, e.g., memory cell 211-A and memory cell 211-C, is an uppermost data state, e.g., "$L_1/L_3$." $L_1$ can indicate and uppermost data state for an SLC, where the SLC is to be programmed to one of only two data states ($L_0$, e.g., the erased state, and $L_1$). $L_3$ can indicate an uppermost data state for a 2-bit MLC, where such a cell is to be programmed to one of four data states $L_0$, $L_1$, $L_2$, and $L_3$. Embodiments are not limited to SLCs or 2-bit MLCs, as other programming configurations for memory cells can be used with the present disclosure. Furthermore, disturb verify operations can be performed for memory cells regardless of the target data state of the memory cell or adjacent memory cells, e.g., it is not limited to use with cells having an erased state as the target data state and adjacent cell(s) having the uppermost data state as the target. Furthermore, with respect to the "worst case" scenario, the "worst case" can be magnified when one or more of the adjacent memory cells being programmed to the uppermost data state (or another data state) are "slow" to program, meaning that they take more than an average number of programming pulses to reach their target data states, which can cause additional disturbance of adjacent inhibited cells.

Figure 3:
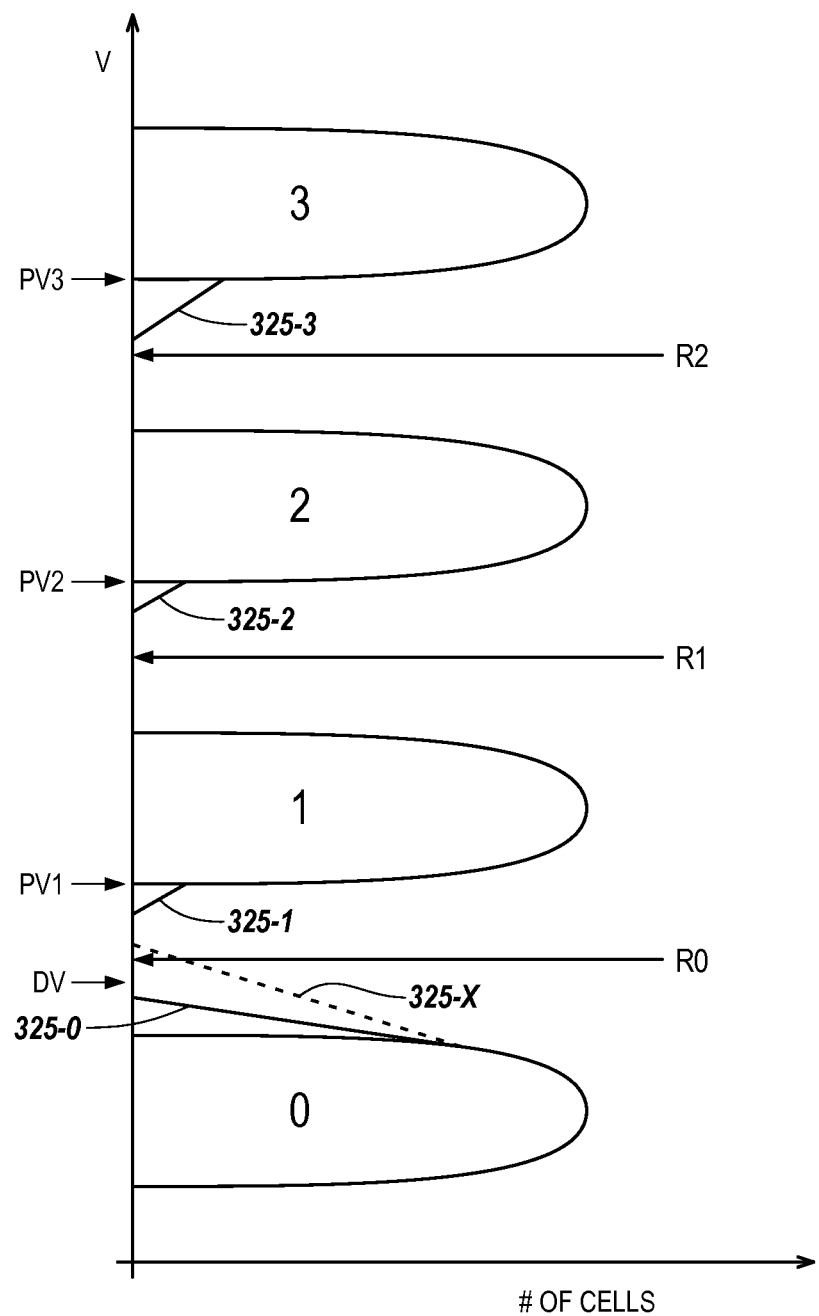
FIG. 3 illustrates a diagram of data states and corresponding threshold voltage distributions in accordance with a number of embodiments of the present disclosure.

FIG. 3 illustrates a diagram of data states and their corresponding threshold voltage distributions in accordance with a number of embodiments of the present disclosure. The distributions represent a statistical breakdown of the magnitude of the threshold voltage (y-axis) of a number of memory cells (the x-axis) programmed to one of four data states 0, 1, 2, and 3. Embodiments are not limited to memory cells programmable to one of four data states, as memory cells can be programmable to more or fewer than four data states.

FIG. 3 includes an illustration of examples of sensing signal magnitudes, e.g., read voltages, R0, R1, and R2 that can be used in a sensing operation, such as a read operation, to determine the data state of a particular memory cell. For example, signal R0 can be used to determine whether the memory cell is in data state 0, signal R1 can be used to determine whether the memory cell is in one of data states 0 and 1 or one of data states 2 and 3, and signal R2 can be used to determine whether the memory cell is in one of data states 0, 1, and 2, or whether it is in data state 3. The sensing signals can be applied to the control gate of the memory cell being sensed. If the sensing signal causes the memory cell to conduct, then the threshold voltage of the memory cell is less than or equal to the magnitude of the sensing signal and therefore the data state of the memory cell can be determined. For example, if the sensing signal R0 causes the memory cell to conduct, then the memory cell is in data state 0.

FIG. 3 includes an illustration of examples of sensing signal magnitudes, e.g., program verify voltages, PV1, PV2, and PV3 that can be used in a sensing operation, such as a program verify operation, to determine whether a particular memory cell has reached a target data state. For example, signal PV1 can be used to verify that the memory cell has reached data state 1, signal PV2 can be used to verify that the memory cell has reached data state 2, and signal PV3 can be used to verify that the memory cell has reached data state 3. The sensing signals can be applied to the control gate of the memory cell being sensed. If the sensing signal causes the memory cell to conduct, then the threshold voltage of the memory cell is less than or equal to the magnitude of the sensing signal and therefore the memory cell has not reached a lowermost edge of a distribution for the corresponding data state (not considering the possibility of error). For example, if the sensing signal PV1 causes the memory cell to conduct, then the memory cell has not reached data state 1. Thus, as illustrated, the program verify voltages can be equal to a lowermost edge of the target distribution for the corresponding data state, e.g., signal PV1 is shown at the lowermost edge of the target threshold voltage distribution for data state 1.

FIG. 3 includes an illustration of an example of a disturb verify signal magnitude, e.g., disturb verify signal DV, that can be used in a sensing operation, such as a disturb verify operation, to determine whether a threshold voltage of a particular memory cell exceeds a particular threshold, e.g., the DV level. In a number of embodiments, the magnitude of the DV signal can be a negative voltage, e.g., where the target distribution for the erased state includes negative threshold voltages. The DV signal can be applied to the control gate of the memory cell being sensed. If the DV signal causes the memory cell to conduct, then the threshold voltage of the memory cell is less than or equal to the magnitude of the DV signal and therefore the threshold voltage of the memory cell has not exceeded the disturb verify threshold. In such an example, the memory cell can be said to have passed the disturb verify operation. If the DV signal does not cause the memory cell to conduct, then the threshold voltage of the memory cell is greater than the magnitude of the DV signal and therefore the threshold voltage of the memory cell has exceeded the disturb verify threshold. In such an example, the memory cell can be said to have failed the disturb verify operation. Although FIG. 3 only illustrates one DV signal, which is used for a disturb verify operation with respect to the erased state, embodiments are not so limited as disturb verify operations can be performed for data states other than the erased state.

Each of the threshold voltage distributions is illustrated including a tail 325 associated therewith. The threshold voltage distribution for data state 0 is illustrated with tail 325-0 and tail 325-X. The threshold voltage distributions for data states 1, 2, and 3 are illustrated with tail 325-1, tail 325-2, and tail 325-3 respectively. The tails 325 illustrate deviations from a desired threshold voltage distribution that is caused by program disturb. The tail 325-X for the erased state illustrated with the dotted line indicates how program disturb may affect the erased state according to some previous approaches. As can be seen, in some instances, program disturb could have caused a cell in the erased state to have a threshold voltage greater than a magnitude of a sensing voltage R0 that is used to distinguish between data state 0 (the erased state) and data state 1. Such situations could have lead to sensing errors for those cells. For example, and as described above with respect to FIG. 2, memory cells in the erased state may be especially susceptible to program disturb when one or more adjacent memory cells were being programmed to an uppermost data state and/or when one or more adjacent memory cells were slow to program such that they required additional programming pulses, putting additional stress on the adjacent memory cell in the erased state.

However, according to a number of embodiments of the present disclosure, the tail 325-X associated with the erased state can be reduced as shown by the tail 325-0, which remains below the magnitude of the sensing signal R0. Also, of note, the magnitude of the tail 325-0 remains approximately equal to or below the magnitude of the disturb verify signal DV. As is described in more detail herein, the tail for the erased state can remain approximately equal to or below the magnitude of the DV signal because once a memory cell fails a disturb verify operation, one or more adjacent cells, which are still being programmed can be inhibited from further programming thereby reducing the effects of program disturb on the adjacent memory cell that is in the erased state.

According to a number of embodiments of the present disclosure, inhibiting certain memory cells from being programmed in response to an additional programming pulse as a result of a failed disturb verify operation can result in slightly widened threshold voltage distributions for memory cells programmed to data states other than the erased state. For example, in some instances, memory cells being programmed to one of data states 1, 2, and 3 may be inhibited during programming as a result of a disturb verify operation performed on an adjacent memory cell. The tail 325-1 and the tail 325-2 show that the threshold voltage distribution for memory cells being programmed to data state 1 and/or data state 2 can be widened on the lower magnitude side of the distribution by such inhibiting. It is more likely, however, that a memory cell being programmed to data state 3 would be inhibited as a result of a disturb verify operations, because such a memory cell would receive more and/or higher magnitude programming pulses while it is being programmed, making it more likely that an adjacent memory cell would experience program disturb such that the memory cell being programmed to data state 3 would be inhibited as a result. Thus, the tail 325-3 is illustrated as being larger than the tail 325-1 and the tail 325-2. A number of embodiments of the present disclosure may limit disturb verify operations to memory cells adjacent to those being programmed to an uppermost data state, e.g., data state 3 in the example of FIG. 3. Such embodiments may not affect the threshold voltage distributions for data states other than the uppermost data state (on the low magnitude side of the distribution).

FIGS. 4A-4F are flow charts illustrating portions of programming operations in accordance with a number of embodiments of the present disclosure. The flow chart in FIG. 4A begins with the start of a programming operation as illustrated at block 471A. A programming pulse can be applied to a selected memory cell(s), which is sometimes referred to herein as a "first" memory cell, such as by applying a programming pulse to a word line (and therefore to all of the memory cells coupled to the word line). In some instances more than one programming pulse can be applied to selected memory cell(s) prior to performing a program verify operation on the selected memory cell(s). As described herein, a program verify operation can include sensing the selected memory cell(s) to determine whether the selected memory cell(s) has reached a target data state or whether the selected memory cell(s) require at least one additional programming pulse to reach the target data state.

After the program verify operation begins, a determination can be made as to whether the selected memory cell(s) passed the program verify ("PV") operation as illustrated at block 472A, e.g., whether a threshold voltage of the selected memory cell(s) exceeds, e.g., clears, a threshold program verify level. If the selected memory cell(s) does not pass the program verify operation, a determination can be made as to whether an adjacent memory cell(s) fails a disturb verify operation as illustrated at block 473A.

If the adjacent memory cell(s) fail the disturb verify operation, a determination can be made as to whether the selected memory cell(s) has exceeded a critical threshold level ("$RV_{crit}$") as illustrated at block 474A. A critical threshold level can be used to limit when a selected memory cell that is disturbing another memory cell adjacent to the selected memory cell will be inhibited from programming. The critical threshold level can be fixed or a programmable option in memory control circuitry, e.g., control circuitry 570 illustrated in FIG. 5. As illustrated at block 475A, if the selected memory cell(s) clears a critical threshold level, then a program inhibit signal can be applied to a bit line(s) corresponding to the selected memory cell(s) that cleared the critical threshold level. For example, applying a program inhibit signal can include biasing the bit line at $V_{cc}$.

With respect to block 473A, if the adjacent memory cell(s) does not fail the disturb verify operation, a program enable signal can be applied to the bit line(s) corresponding to the selected memory cell(s) as illustrated at block 477A. Returning to block 474A, if the selected memory cell(s) does not clear the critical threshold level, the program enable signal can be applied to the bit line(s) corresponding to the selected memory cell(s) as illustrated at block 477A. For example, applying a program enable signal can include biasing the bit line at 0 volts.

Referring back to block 472A, if the selected memory cell(s) clear a threshold program verify level, then a program inhibit signal has been applied to a bit line(s) corresponding to the selected memory cell(s) that cleared the threshold program verify level, as illustrated at block 475A. As illustrated at block 478A, if all of the memory cells in the page being programmed have passed a program verify operation, then the programming operation can end as illustrated at block 479A. Otherwise, a number of additional programming pulses can be applied as illustrated at block 476A.

Figure 4A:
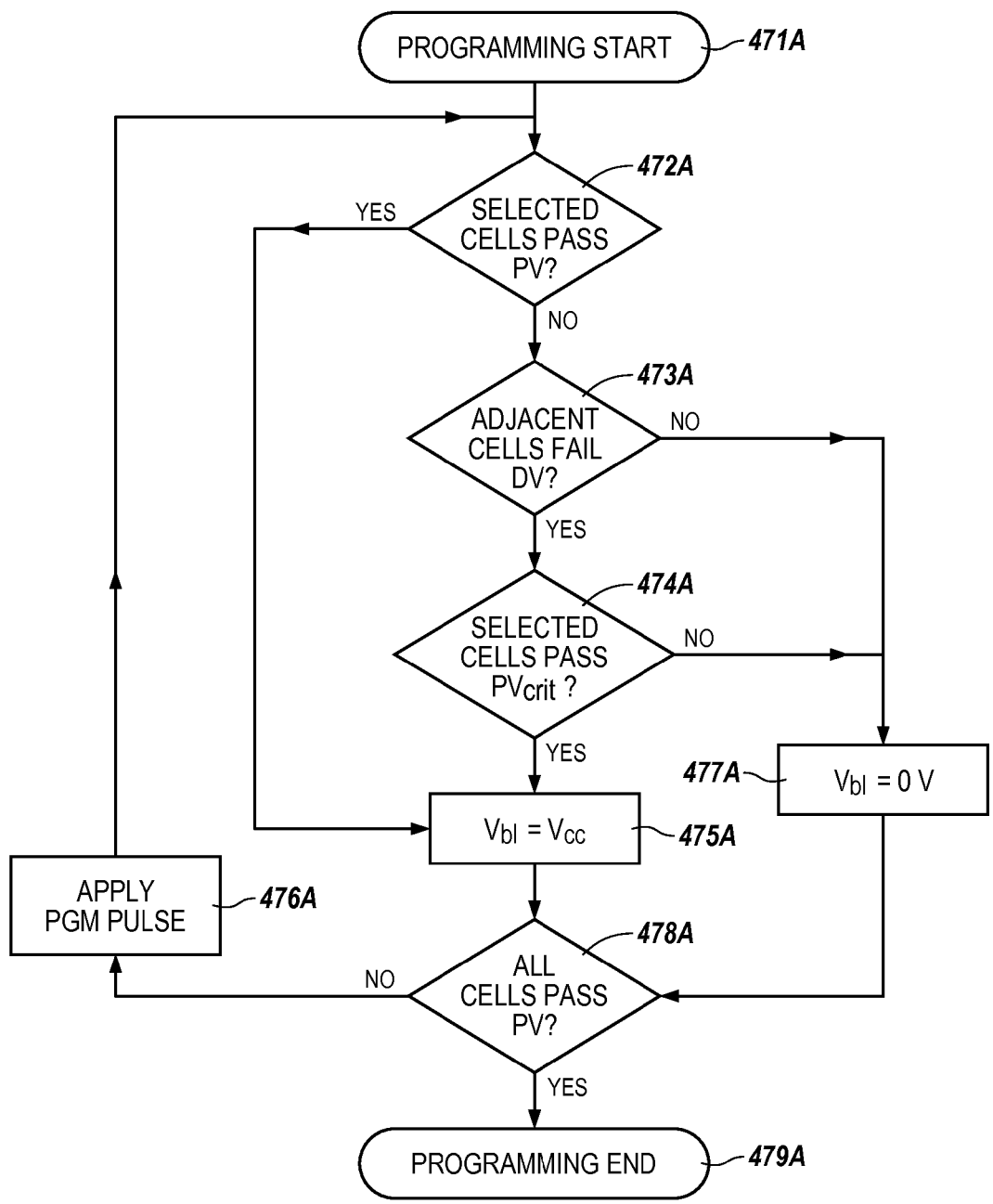
FIGS. 4A-4F are flow charts illustrating portions of programming operations in accordance with a number of embodiments of the present disclosure.
Figure 4B:
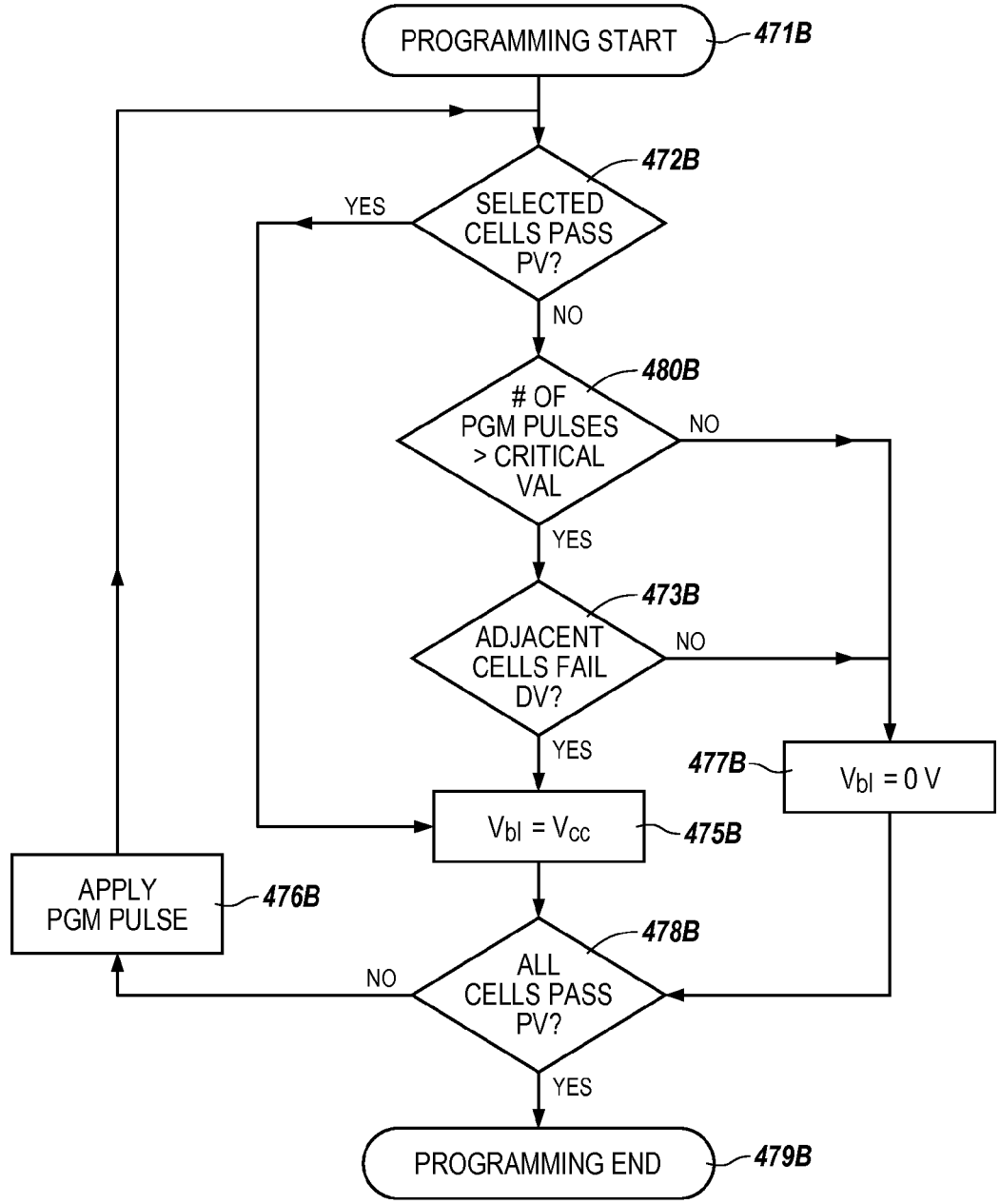

FIG. 4B begins with the start of a programming operation as illustrated at block 471B. In some instances more than one programming pulse can be applied to a selected memory cell(s) prior to performing a program verify operation on the selected memory cell(s). After the program verify operation begins, a determination can be made as to whether the selected memory cell(s) passed the program verify ("PV") operation as illustrated at block 472B. If the selected memory cell(s) passes the program verify operation, then a program inhibit signal can be applied to a bit line(s) corresponding to the selected memory cell(s) as illustrated at block 475B, e.g., $V_{b1}=V_{cc}$, and (unless all of the memory cells of the page being programmed have also passed program verify—see block 478B) a number of additional programming pulses are applied to the selected memory cell(s) as illustrated at block 476B. If, however, the selected memory cell(s) does not pass the program verify operation, a determination can be made as to whether a number of programming pulses applied to the selected memory cell(s) has exceeded a threshold number of pulses, e.g., a "critical value" of pulses, as illustrated at block 480B.

A threshold number of programming pulses can be used to limit when a disturb verify operation is performed on a memory cell adjacent to a selected memory cell. The threshold number of programming pulses can be fixed or a programmable option in memory control circuitry, e.g., control circuitry 570 illustrated in FIG. 5. The threshold number of programming pulses can be a total number for a memory cell, or can be specified dependent upon the target data state of a memory cell. For example, a threshold number of programming pulses can be number greater than a number normally used to program a memory cell to an uppermost data state. As described herein some memory cells are slow to program, meaning that they require more than an average number of programming pulses to reach a particular data state. Setting the threshold number of programming pulses to a value above this average allows the disturb verify operation to be reserved for those memory cell(s) adjacent to slow memory cells, which may be more likely to contribute program disturb effects to adjacent memory cell(s).

As illustrated at block 473B, if the number of programming pulses applied to selected memory cell(s) has exceeded the threshold number of programming pulses, then a disturb verify operation can be performed on an adjacent memory cell(s). If the adjacent memory cell(s) fails the disturb verify operation, then a program inhibit signal can be applied to a bit line(s) corresponding to the selected memory cell(s), e.g., $V_{b1}=V_{cc}$, as illustrated at block 475B. As illustrated at block 478B, if all of the memory cells in the page being programmed have passed a program verify operation, then the programming operation can end as illustrated at block 479B. Otherwise, a number of additional programming pulses can be applied as illustrated at block 476B. With respect to blocks 480B and 473B respectively, if the number of programming pulses has not exceeded the threshold number of programming pulses or if the adjacent memory cell(s) did not fail the disturb verify operation, then a program enable signal, e.g., $V_{b1}=0V$, can be applied to a bit line(s) corresponding to the selected memory cell(s), as illustrated at block 477B. Accordingly, unless all of the memory cells of the page being programmed pass program verify (see block 478B), a number of additional programming pulses can be applied to the selected memory cell(s) as illustrated at block 476B. If all of the memory cells of the page being programmed have passed the program verify operation, then the programming operation can end as illustrated at block 479B.

Figure 4C:
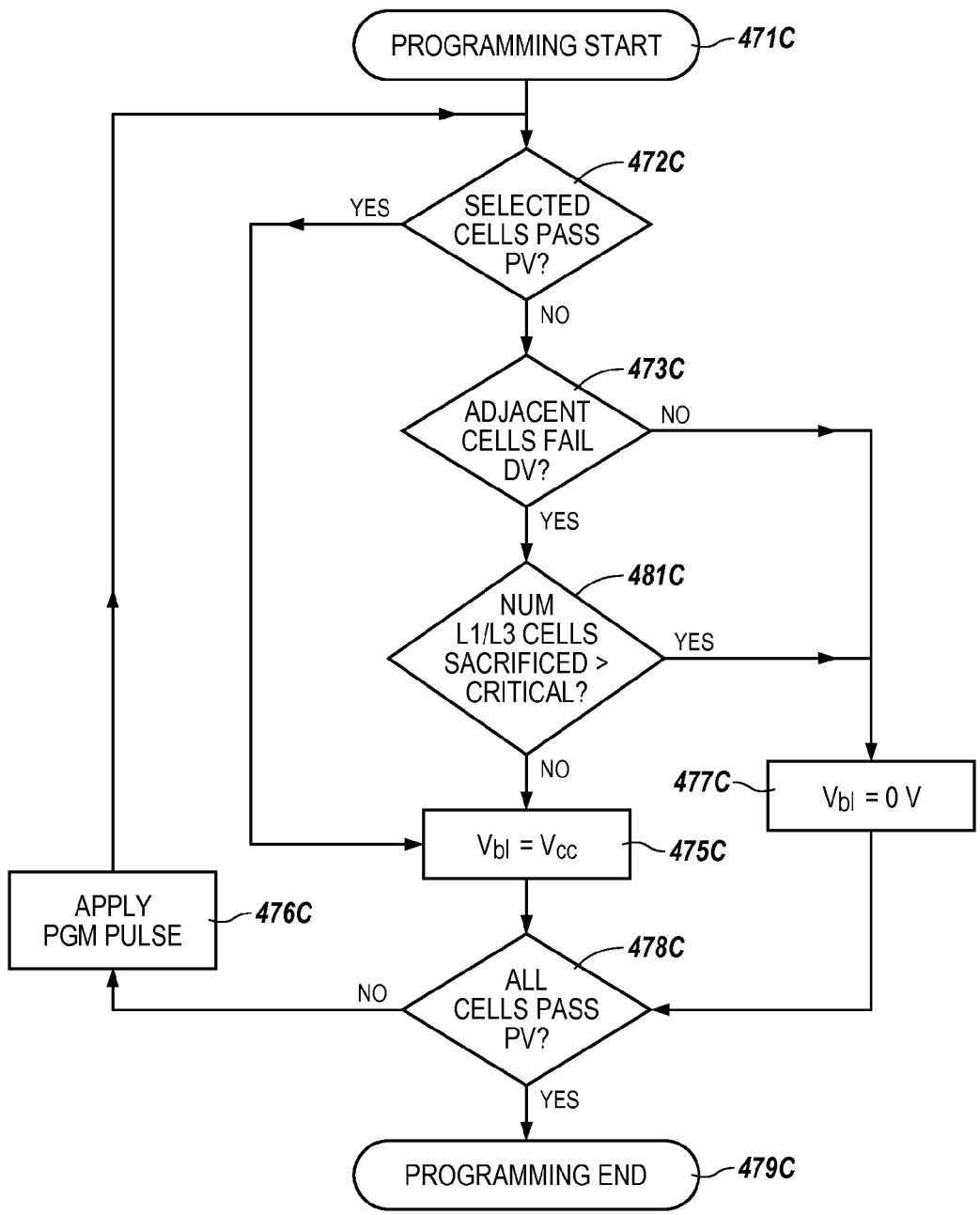

FIG. 4C begins with the start of a programming operation as illustrated at block 471C. In some instances more than one programming pulse can be applied to a selected memory cell(s) prior to performing a program verify operation on the selected memory cell(s). After the program verify operation begins, a determination can be made as to whether the selected memory cell(s) passed the program verify ("PV") operation as illustrated at block 472C. If the selected memory cell(s) does not pass the program verify operation, a determination can be made as to whether an adjacent memory cell(s) fails a disturb verify operation as illustrated at block 473C.

If the adjacent memory cell(s) fails the disturb verify operation, a determination can be made as to whether a total number of memory cells that have already been program inhibited as a result of disturb verify operations, i.e., a total number of "sacrificed" memory cells, exceeds a threshold number of sacrificed memory cells, e.g., whether the number of $L_1/L_3$ cells sacrificed exceeds a "critical" value, as illustrated at block 481C. The threshold number of sacrificed memory cells can be fixed or a programmable option in memory control circuitry, e.g., control circuitry 570 illustrated in FIG. 5. The control circuitry can be configured to count the number of sacrificed memory cells that have been inhibited as a result of disturb verify operations and store the count in memory associated with the control circuitry. In some embodiments, the count can be of sacrificed memory cells per page, per block, or per array. For example, a threshold number of sacrificed memory cells can be number corresponding to an amount of data correctable by error correction, e.g., error correction code (ECC) circuitry on a per-page basis. In some instances, inhibiting a memory cell that has not reached its targeted data sate from further programming pulses may result in a later erroneous read of that memory cell. Limiting the number of sacrificed memory cells to a number corresponding to an amount of data correctable by ECC, e.g., with or without an added margin for other errors, can be beneficial in helping to preserve data integrity. In a number of embodiments, when the number of sacrificed memory cells in a page that have been inhibited as a result of disturb verify operations exceeds the threshold number, subsequent disturb verify operations can be ceased and/or skipped. In a number of embodiments, when the number of sacrificed memory cells in a page or in a block that have been inhibited as a result of disturb verify operations exceeds the threshold number, the programming operation can be ceased. In a number of other embodiments, when the number of sacrificed memory cells in a page that have been inhibited as a result of disturb verify operations exceeds the threshold number, no more memory cells in the page are inhibited even if an adjacent memory cell(s) fail a disturb verify operation, as described further below.

With respect to blocks 472C and 481C respectively, if the selected memory cell(s) passes the program verify operation or if the threshold number of sacrificed memory cells inhibited as a result of disturb verify operations has not been exceeded (and the adjacent cell(s) fails the disturb verify operation), then a program inhibit signal can be applied to the bit line(s) corresponding to the selected memory cell(s), e.g., $V_{b1}=V_{cc}$, as illustrated at block 475C, and (unless all of the memory cells pass program verify—see block 478C) a number of additional programming pulses can be applied to the selected memory cell(s) as illustrated at block 476C. With respect to blocks 473C and 481C respectively, if the adjacent memory cell(s) did not fail the disturb verify operation or if the threshold number of sacrificed memory cells inhibited as a result of disturb verify operations has been exceeded, then a program enable signal, e.g., $V_{b1}=0V$, can be applied to the bit line(s) corresponding to the selected memory cell(s), as illustrated at block 477C, and (unless all of the memory cells pass program verify—see block 478C) a number of additional programming pulses can be applied to the selected memory cell(s) as illustrated at block 476C. If all of the memory cells of the page being programmed pass the program verify operation, as illustrated at block 478C, then the programming operation can end as illustrated at block 479C.

Figure 4D:
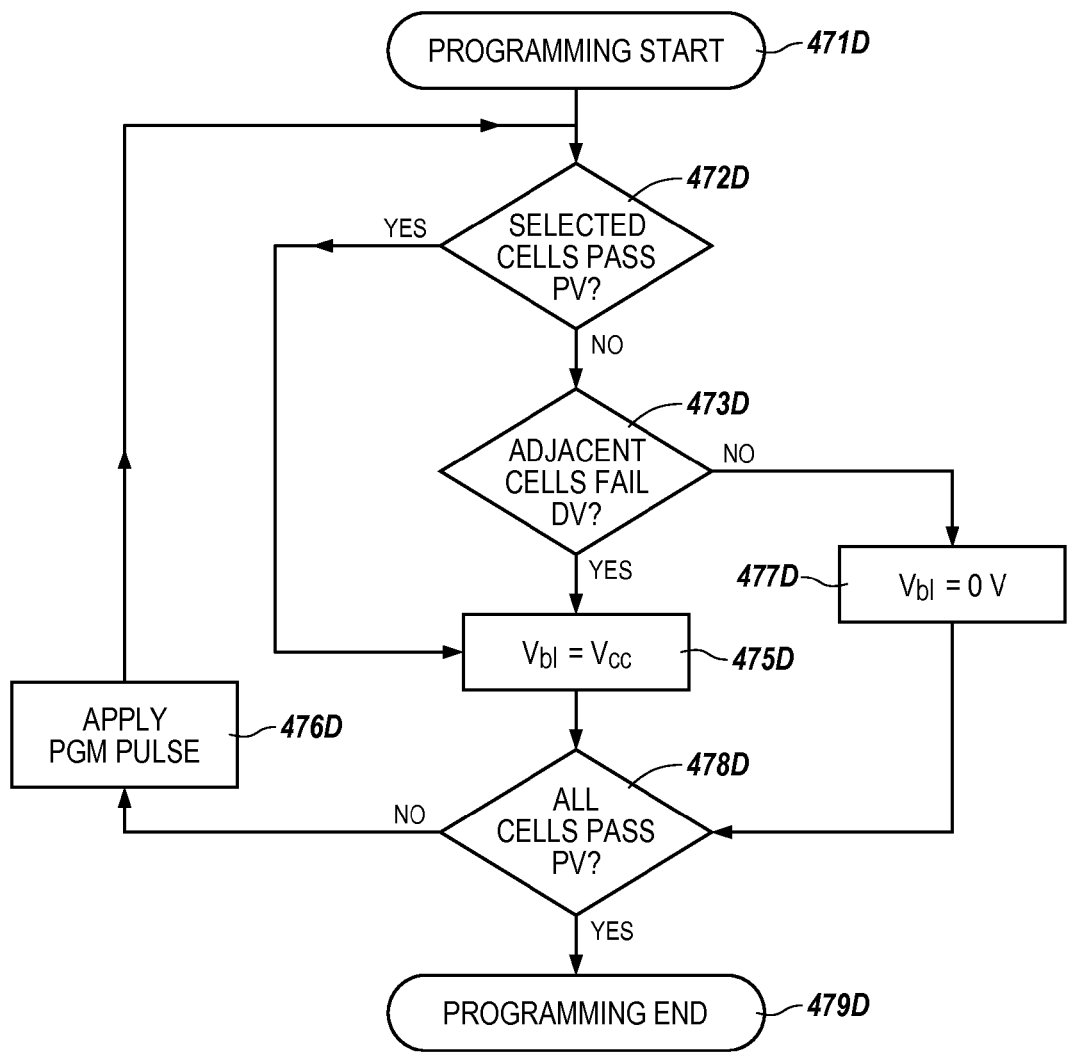

FIG. 4D begins with the start of a programming operation as illustrated at block 471D. In some instances more than one programming pulse can be applied to a selected memory cell(s) prior to performing a program verify operation on the selected memory cell(s). After the program verify operation begins, a determination can be made as to whether the selected memory cell(s) passed the program verify ("PV") operation as illustrated at block 472D. If the selected memory cell(s) does not pass the program verify operation, a determination can be made as to whether an adjacent memory cell(s) fails a disturb verify operation as illustrated at block 473D.

With respect to blocks 472D and 473D respectively, if the selected memory cell(s) passes the program verify operation or if the adjacent memory cell(s) fails the disturb verify operation, then a program inhibit signal can be applied to a bit line(s) corresponding to the selected memory cell(s), e.g., $V_{b1}=V_{cc}$, as illustrated at block 475D, and (unless all of the memory cells pass program verify—see block 478D) a number of additional programming pulses can be applied on the selected memory cell(s) line as illustrated at block 476D. With respect to block 473D, if the adjacent memory cell(s) did not fail the disturb verify operation, then a program enable signal, e.g., $V_{b1}=0V$, can be applied to the bit line(s) corresponding to the selected memory cell(s), as illustrated at block 477D, and (unless all of the memory cells pass program verify—see block 478D) a number of additional programming pulses can be applied to the selected memory cell(s) as illustrated at block 476D. If all of the memory cells of the page being programmed pass the program verify operation, as illustrated at block 478D, then the programming operation can end as illustrated at block 479D.

Figure 4E:
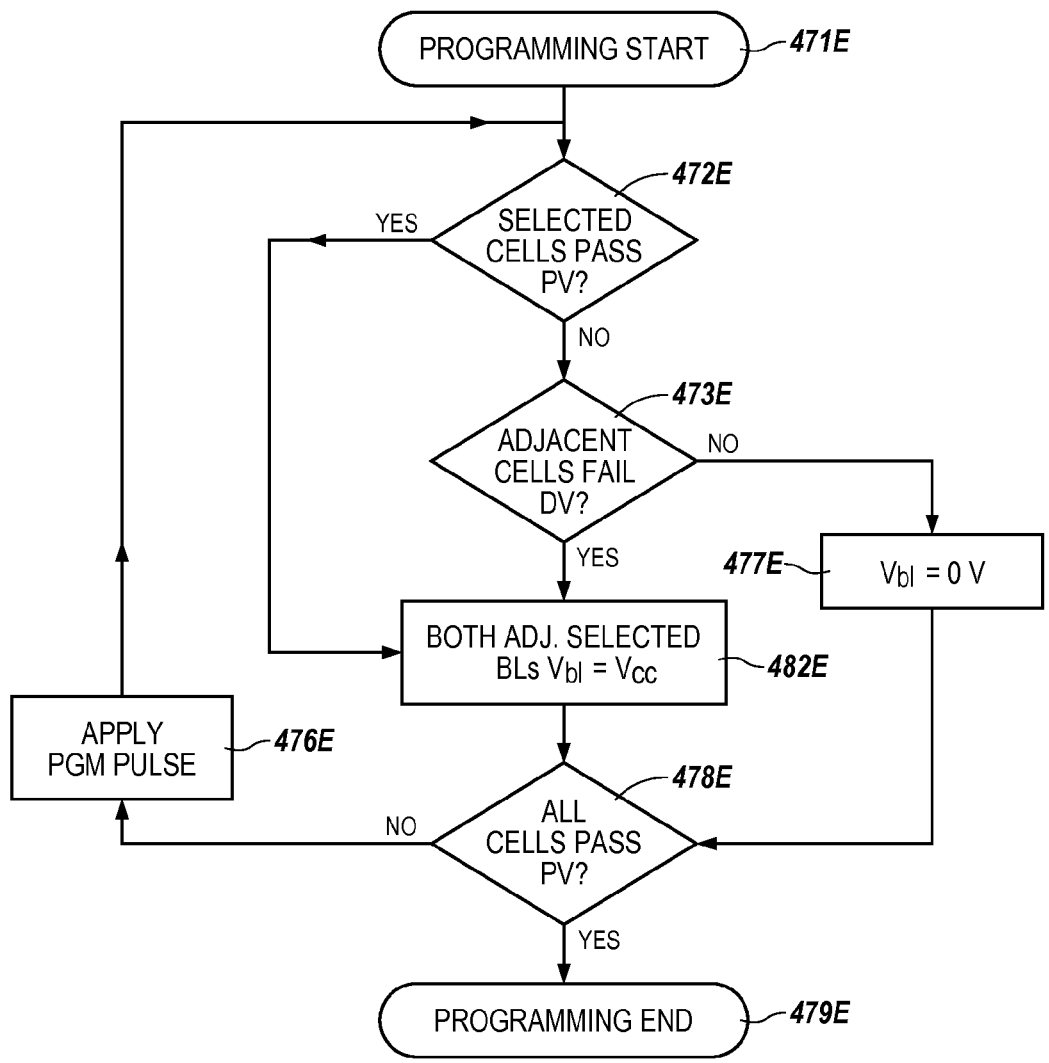

FIG. 4E begins with the start of a programming operation as illustrated at block 471E. In some instances more than one programming pulse can be applied to (at least) two selected memory cells (where the two selected memory cells are both adjacent to a common adjacent memory cell) prior to performing a program verify operation on the selected memory cells. After the program verify operation begins, a determination can be made as to whether the selected memory cells pass the program verify ("PV") operation as illustrated at block 472E. If the selected memory cells do not pass the program verify operation, a determination can be made as to whether the common adjacent memory cell fails a disturb verify operation as illustrated at block 473E.

In some embodiments, if the common adjacent memory cells fails the disturb verify operation, then a program inhibit signal, e.g.; $V_{b1}=V_{cc}$, can be applied to the two bit lines corresponding to both selected memory cells (that are adjacent to the memory cell that failed the disturb verify operation) as illustrated at block 482E, and (unless all of the memory cells pass program verify—see block 478E) a number of additional programming pulses can be applied to the selected memory cells as illustrated at block 476E. Sacrificing, both memory cells adjacent to the cell that failed the disturb verify operation can further decrease a likelihood that the disturbed memory cell will cause an error, e.g., a sensing error.

With respect to block 472E, if both selected memory cells pass the program verify operation, then the program inhibit signal can be applied to the two bit lines corresponding to both selected memory cells as illustrated at block 482E, and (unless all of the memory cells pass program verify—see block 478E) a number of additional programming pulses can be applied to other selected memory cells as illustrated at block 476E. With respect to block 473E, if the common adjacent memory cell(s) does not fail the disturb verify operation, then a program enable signal, e.g., $V_{b1}=0V$, can be applied to the two bit lines corresponding to the selected memory cells, as illustrated at block 477E, and (unless all of the memory cells pass program verify—see block 478E) a number of additional programming pulses can be applied to the selected memory cells as illustrated at block 476E. If all of the memory cells of the page being programmed pass the program verify operation, as illustrated at block 478E, then the programming operation can end as illustrated at block 479E.

Figure 4F:
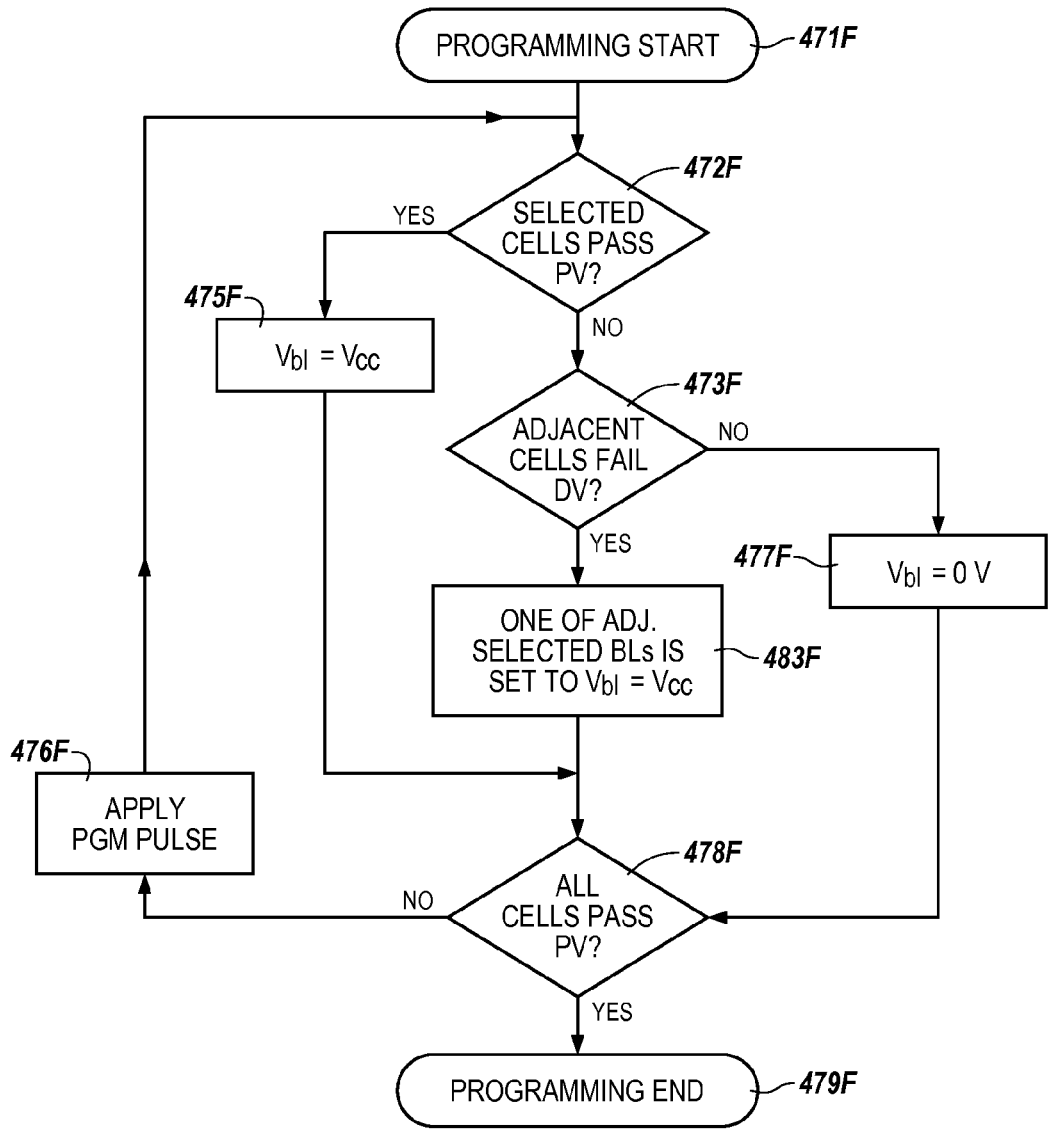

FIG. 4F begins with the start of a programming operation as illustrated at block 471F. In some instances more than one programming pulse can be applied to (at least) two selected memory cells (where the two selected memory cells are both adjacent to a common adjacent memory cell) prior to performing a program verify operation on the selected memory cells. After the program verify operation begins, a determination can be made as to whether the selected memory cells pass the program verify ("PV") operation as illustrated at block 472F. If the selected memory cells do not pass the program verify operation, a determination can be made as to whether the common adjacent memory cell fails a disturb verify operation as illustrated at block 473F.

In some embodiments, if the common adjacent memory cell fails the disturb verify operation, then a program inhibit signal, e.g., $V_{b1}=V_{cc}$, can be applied to only one of the two bit lines corresponding to the selected memory cells (that are adjacent to the memory cell that failed the disturb verify operation) as illustrated at block 483F, and (unless all of the memory cells pass program verify—see block 478F) a number of additional programming pulses can be applied to the other selected memory cells as illustrated at block 476F. A program enable signal, e.g., $V_{b1}=0V$, can be applied to the bit line corresponding to the other selected memory cell that is adjacent to the memory cell that failed the disturb verify operation to allow continued programming of that memory cell. Sacrificing one of the memory cells adjacent to the cell that failed the disturb verify operation can decrease a likelihood that the disturbed memory cell will cause an error, e.g., a sensing error, while also preserving an ability of the selected memory cells to store information. Various criteria can be used to determine which of the two selected memory cells to sacrifice. For example, the determination can be arbitrary, e.g., random. As another example, the sacrificed memory cell can be the one that reduces a total number of memory cells to be sacrificed, e.g., in an instance where one of the selected memory cells has already failed a previous disturb verify operation or may fail a future disturb verify operation due to being "over-programmed." An over-programmed memory cell can be a memory cell that stores a charge outside of a normal distribution, but below a disturb verify level, e.g., as is shown by tail 325-0 in FIG. 3.

With respect to block 472F, if the two selected memory cells pass the program verify operation, a program inhibit signal can be applied to the corresponding bit lines as illustrated at block 475F, and (unless all of the memory cells in the page being programmed in that operation pass a program verification—see block 478F) a number of additional programming pulses can be applied to the other selected memory cells as illustrated at block 476F. With respect to block 473F, if the adjacent memory cells do not fail the disturb verify operation, then a program enable signal, e.g., $V_{b1}=0V$, can be applied to bit lines corresponding to the selected memory cells, as illustrated at block 477F. If all of the memory cells in the page being programmed pass the program verify operation, as illustrated at block 478F, then the programming operation can end as illustrated at block 479F.

The disturb verify operation referenced in FIGS. 4A-4F can include sensing a memory cell(s) adjacent to the selected memory cell(s) to determine whether a threshold voltage of the adjacent memory cell(s) exceeds a disturb threshold. The disturb verify operation can be selectively disabled, e.g., by memory control circuitry. For example, the disturb verify operation can be selectively disabled in response to the cell on which the disturb verify operation is to be performed being in a data state other than an erased state. As another example, the disturb verify operation can be selectively disabled in response to the selected memory cell having a target data state below a threshold data state, e.g., the uppermost data state. Furthermore, the disturb verify operation can be selectively disabled in response to the number of programming pulses applied to the selected memory cell(s) being less than a threshold number of programming pulses. In a number of embodiments, a disturb verify operation is only performed on memory cells that are in a lowermost data state, e.g., an erased state. Thus, in some instances, a disturb verify operation can be performed in response to a memory cell adjacent to a selected memory cell being in an erased state and the selected memory cell having a target data state that is an uppermost data state. Furthermore, in a number of embodiments, a disturb verify operation may only be performed on a memory cell that is in an erased state and located adjacent to two memory cells that both have a target data state that is the uppermost data state. Such embodiments can be beneficial because a greatest difference in data states between two adjacent memory cells is the situation most likely to contribute program disturb effects to the adjacent memory cell in the erased state.

Figure 5:
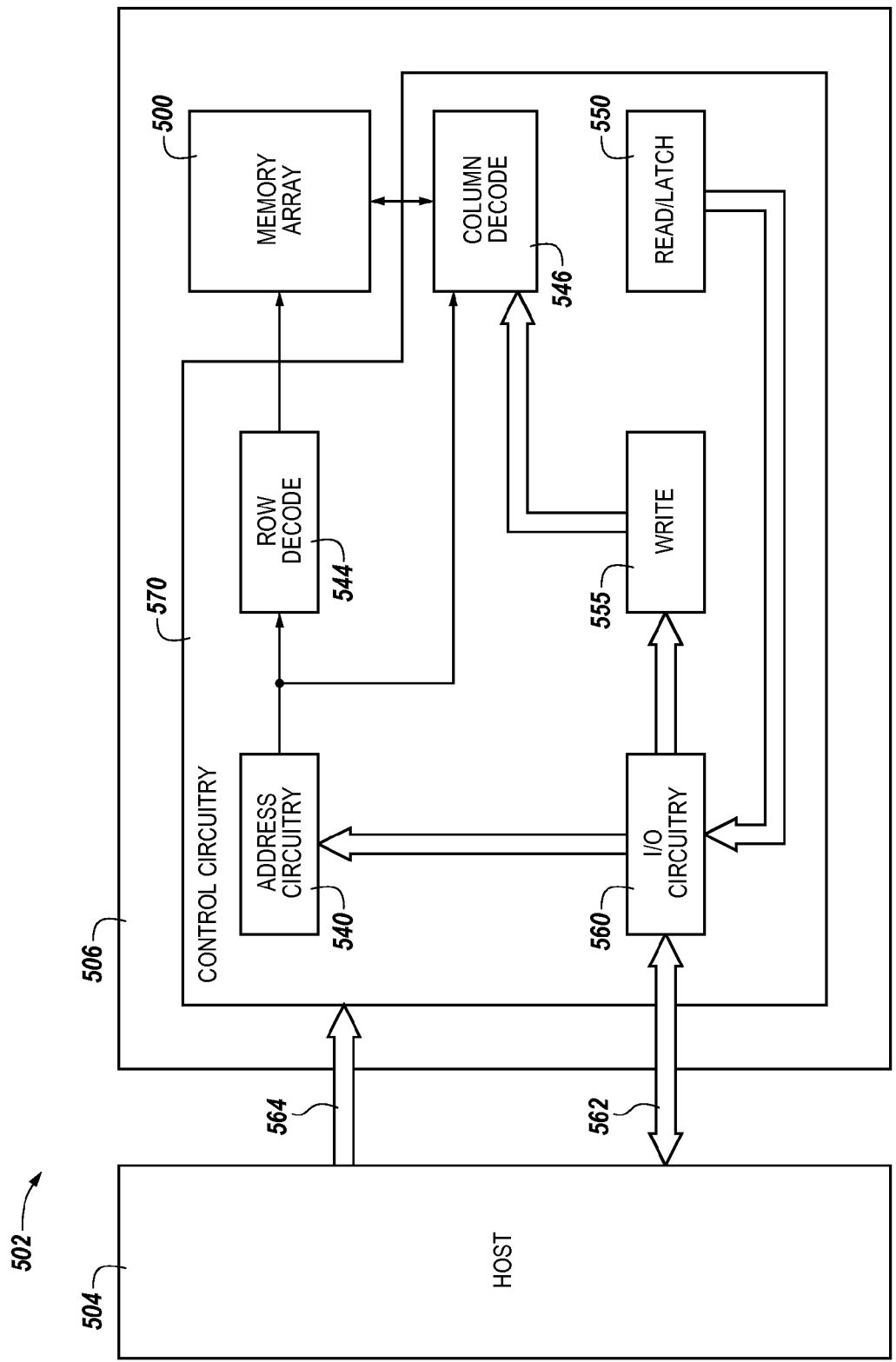
FIG. 5 illustrates a block diagram of an electronic memory system having a memory device operated in accordance with a number of embodiments of the present disclosure.

FIG. 5 illustrates a block diagram of an apparatus in the form of an electronic memory system 502 having a memory device 506 operated in accordance with a number of embodiments of the present disclosure. The memory system 502 includes a host 504, e.g., a processor, a computing device including a number of processors, an application specific integrated circuit (ASIC), etc., coupled to the memory device 506. The memory device 506 includes a memory array 500. The memory array 500 can be analogous to the memory array 100 previously described in connection with FIG. 1A. Although one memory array 500 is shown in FIG. 5, embodiments of the present disclosure are not so limited, e.g., the memory device 506 can include more than one memory array 500.

The memory device 506, which can itself be considered an "apparatus," includes an array 500 of memory cells, which can be floating gate flash memory cells with a NAND architecture, as previously described herein. The control circuitry 570 includes address circuitry 540 to latch address signals provided over I/O connections 562 through I/O circuitry 560. Address signals are received and decoded by a row decoder 544 and a column decoder 546 to access the memory array 500. In light of the present disclosure, it will be appreciated by those skilled in the art that the number of address input connections depends on the density and architecture of the memory array 500 and that the number of addresses increases with both increased numbers of memory cells and increased numbers of memory blocks and arrays.

The memory device 506 includes control circuitry 570 coupled to the memory array 500. The control circuitry 570 can be configured to apply a number of programming pulses to a first memory cell, perform a disturb verify operation on a second memory cell adjacent to the first memory cell, and enable programming of the first memory cell in response to the second memory cell passing the disturb verify operation.

The control circuitry 570 can sense data in the memory array 500 by sensing voltage and/or current changes in the memory array columns using sensing circuitry that in this embodiment can be read/latch circuitry 550. The read/latch circuitry 550 can read and latch a page, e.g., a row, of data from the memory array 500. I/O circuitry 560 is included for bi-directional data communication over the I/O connections 562 with the host 504. Write circuitry 555 is included to write data to the memory array 500.

The control circuitry 570 decodes signals provided by control connections 564 from the host 504. These signals can include chip signals, write enable signals, and address latch signals that are used to control the operations on the memory array 500, including data sensing, data write, and data erase operations, as described herein. In a number of embodiments, the control circuitry 570 is responsible for executing instructions from the host 504 to perform the operations according to embodiments of the present disclosure. The control circuitry 570 can be a state machine, a sequencer, or some other type of controller. It will be appreciated by those skilled in the art that additional circuitry and control signals can be provided, and that the memory device detail of FIG. 5 has been reduced to facilitate ease of illustration.

CONCLUSION

Apparatuses and methods for disturb verify for programming operations are described. Programming memory cells can include applying a number of programming pulses to a first memory cell, performing a disturb verify operation on a second memory cell adjacent to the first memory cell, and inhibiting the first memory cell from programming in response to the second memory cell failing the disturb verify operation.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of a number of the associated listed items.

As used herein, the term "and/or" includes any and all combinations of a number of the associated listed items. As used herein the term "or," unless otherwise noted, means logically inclusive or. That is, "A or B" can include (only A), (only B), or (both A and B). In other words, "A or B" can mean "A and/or B" or "a number of A and B."

It will be understood that, although the terms first, second, third, etc. may be used herein to describe various elements, these elements should not be limited by these terms. These terms are only used to distinguish one element from another element. Thus, a first element could be termed a second element without departing from the teachings of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the embodiments of the present disclosure includes other applications in which the above structures and methods are used. Therefore, the scope of the present invention should be determined with reference only to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for programming memory cells, comprising:
applying a number of programming pulses to a first memory cell;
performing a disturb verify operation to determine whether a second memory cell adjacent to the first memory cell exceeds an uppermost acceptable level for a data state of the second memory cell; and
inhibiting the first memory cell from programming in response to the second memory cell failing the disturb verify operation.

2. The method of claim 1, wherein the method includes enabling programming of the first memory cell in response to the second memory cell passing the disturb verify operation.

3. The method of claim 1, wherein performing the disturb verify operation on a second memory cell adjacent to the first memory cell comprises performing the disturb verify operation on the second memory cell if the second memory cell is in a lowermost data state of a number of data states and a target data state of the first memory cell is an uppermost data state of the number of data states.

4. The method of claim 3, wherein applying a number of programming pulses to a first memory cell comprises applying the number of programming pulses to the first memory cell and a third memory cell adjacent to the second memory cell, and performing a disturb verify operation on a second memory cell adjacent to the first memory cell comprises performing the disturb verify operation on the second memory cell if the second memory cell is in an erased state and a target data state of the first memory cell and the third memory cell is an uppermost data state of a number of data states.

5. The method of claim 1, wherein performing a disturb verify operation includes determining whether a threshold voltage of the second memory cell exceeds a particular threshold corresponding to a target data state of the second memory cell.

6. A method for programming memory cells, comprising:
applying a number of programming pulses to a first memory cell and a third memory cell that are adjacent to a second memory cell;
performing a disturb verify operation to determine whether the second memory cell exceeds an uppermost acceptable level for a data state of the second memory cell;
inhibiting at least one of the first and the third memory cells from further programming in response to the second memory cell failing the disturb verify operation.

7. The method of claim 6, wherein the method includes selectively disabling the disturb verify operation.

8. The method of claim 6, wherein the method includes applying an additional programming pulse to the first and the third memory cells after performing the disturb verify operation.

9. The method of claim 6, wherein inhibiting at least one of the first and the third memory cells from further programming comprises inhibiting both of the first and the third memory cells from further programming.

10. The method of claim 6, wherein inhibiting at least one of the first and the third memory cells from further programming comprises inhibiting only one of the first and the third memory cells from further programming.

11. An apparatus, comprising:
an array of memory cells; and
control circuitry coupled to the array, wherein the control circuitry is configured to:
apply a number of programming pulses to a first memory cell of the array and a third memory cell of the array, wherein the first and the second memory cells are adjacent to a second memory cell of the array;
perform a disturb verify operation to determine whether the second memory cell exceeds an uppermost acceptable level for a data state of the second memory cell;
inhibit at least one of the first and the third memory cells from further programming in response to the second memory cell failing the disturb verify operation.

12. The apparatus of claim 11, wherein the control circuitry being configured to perform a disturb verify operation on the second memory cell comprises the control circuitry being configured to perform the disturb verify operation on the second memory cell if the first and the third memory cells have a target data state of an uppermost data state of a number of data states.

13. The apparatus of claim 11, wherein the control circuitry is configured to perform the disturb verify operation by applying a sensing voltage to the second memory cell, wherein the sensing voltage is greater than an uppermost voltage associated with an erased state.

14. The apparatus of claim 13, wherein teh sensing voltage is negative.

15. The apparatus of claim 11, further including a host coupled to the control circuitry.

* * * * *

UNITED STATES PATENT AND TRADEMARK OFFICE
CERTIFICATE OF CORRECTION

PATENT NO.       : 8,638,607 B2
APPLICATION NO.  : 13/267602
DATED            : January 28, 2014
INVENTOR(S)      : Karthik Sarpatwari et al.

It is certified that error appears in the above-identified patent and that said Letters Patent is hereby corrected as shown below:

In the Claims:

In column 18, line 42, in Claim 14, delete "teh" and insert -- the --, therefor.

Signed and Sealed this
Twenty-ninth Day of April, 2014

Michelle K. Lee
*Deputy Director of the United States Patent and Trademark Office*